(12) United States Patent
Jeong et al.

(10) Patent No.: US 8,530,888 B2
(45) Date of Patent: Sep. 10, 2013

(54) ORGANIC LIGHT-EMITTING DISPLAY DEVICE AND METHOD OF MANUFACTURING THE SAME

(75) Inventors: Hee-Seong Jeong, Yongin (KR); Soon-Ryong Park, Yongin (KR); Woo-Suk Jung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 303 days.

(21) Appl. No.: 12/929,895

(22) Filed: Feb. 23, 2011

(65) Prior Publication Data

US 2011/0204342 A1 Aug. 25, 2011

(30) Foreign Application Priority Data

Feb. 24, 2010 (KR) .................. 10-2010-0016663

(51) Int. Cl.
*H01L 35/24* (2006.01)
(52) U.S. Cl.
USPC .................................... 257/40; 257/E51.001
(58) Field of Classification Search
USPC ............................................. 257/40, E51.001
See application file for complete search history.

(56) References Cited

U.S. PATENT DOCUMENTS

| | | | |
|---|---|---|---|
| 5,478,658 | A | 12/1995 | Dodabalapur et al. |
| 5,682,402 | A | 10/1997 | Nakayama et al. |
| 2005/0023966 | A1 | 2/2005 | Suh et al. |
| 2006/0097264 | A1 | 5/2006 | Kim et al. |
| 2006/0175966 | A1 | 8/2006 | Yamada et al. |
| 2006/0279190 | A1 | 12/2006 | Nakayama |
| 2007/0114919 | A1 | 5/2007 | Sotoyama |
| 2008/0036361 | A1 | 2/2008 | Tsai et al. |

FOREIGN PATENT DOCUMENTS

| | | |
|---|---|---|
| EP | 1 657 764 A1 | 5/2006 |
| JP | 02-234101 A | 9/1990 |
| JP | 07-027902 A | 1/1995 |
| JP | 7-320864 A | 12/1995 |
| JP | 8-250786 A | 9/1996 |
| JP | 2007-053115 A | 8/2006 |
| JP | 2007-005784 A | 1/2007 |
| JP | 2007-141736 A | 6/2007 |
| KR | 10 2004-0040242 A | 5/2004 |
| KR | 10 2005-0013870 A | 2/2005 |
| KR | 10-2006-0042728 B1 | 5/2006 |
| KR | 10 2006-0054919 A | 5/2006 |
| KR | 10-0721952 B1 | 5/2007 |
| KR | 10-2008-0013826 A | 2/2008 |

(Continued)

OTHER PUBLICATIONS

Korean Notice of Allowance in KR 10-2010-0016663, dated Oct. 31, 2011 (Jeong, et al.).

(Continued)

*Primary Examiner* — Anthony Ho
(74) *Attorney, Agent, or Firm* — Lee & Morse, P.C.

(57) ABSTRACT

An organic light-emitting display device includes a substrate, a first electrode on the substrate, the first electrode including a reflection film, a hole injection layer on the first electrode, a hole transport layer on the hole injection layer, an emission layer on the hole transport layer, an electron injection transport layer on the emission layer, a second electrode on the electron injection transport layer, the second electrode including a semi-transmissive reflective material, and a control layer positioned between a lower surface of the hole injection layer and an upper surface of the hole transport layer, the control layer including an organic material and having a refractive index lower than that of an adjacent layer.

13 Claims, 2 Drawing Sheets

(56) References Cited

FOREIGN PATENT DOCUMENTS

| KR | 10-2008-0041939 A | 5/2008 |
| WO | WO 2006/121015 A1 | 11/2006 |
| WO | WO 2009/028620 A1 | 3/2009 |
| WO | WO 2009/125471 A1 | 10/2009 |

OTHER PUBLICATIONS

Japanese Office action dated Mar. 27, 2012 related Japanese application (Jeong, et al.).

ORGANIC LIGHT-EMITTING DISPLAY DEVICE AND METHOD OF MANUFACTURING THE SAME

BACKGROUND

1. Field

Example embodiments relate to an organic light-emitting display device and a method of manufacturing the same. More particularly, example embodiments relate to an organic light-emitting display device having improved light coupling efficiency and a method of manufacturing the organic light-emitting display device.

2. Description of the Related Art

Light efficiency of organic light-emitting display devices is classified into internal efficiency and external efficiency. The internal efficiency relies on photoelectric conversion efficiency of an organic light-emitting material, and the external efficiency, i.e., light coupling efficiency, depends on each refractive index of each layer of the organic light-emitting display device.

The organic light-emitting display devices can be classified into a top emission type and a bottom emission type according to a light emitting direction. In the top emission type organic light-emitting display device, an image is displayed in a direction directed away from a substrate on which an organic light-emitting diode is formed. The top emission type organic light-emitting display device may have a greater aperture ratio than that of the bottom emission type organic light-emitting display device, i.e., a device in which an image is displayed toward a substrate on which an organic light-emitting diode is formed, and thus may have higher light emission efficiency.

In the top emission type organic light-emitting display device, a transparent cathode is formed in an uppermost portion of the organic light-emitting display device. However, a material for forming the cathode may be limited due to a low work function of the cathode, i.e., a basic characteristic of the cathode, thereby limiting light efficiency of the organic light-emitting display device.

SUMMARY

Embodiments are directed to an organic light-emitting display device and a method of manufacturing the same, which substantially overcome one or more of the problems due to the limitations and disadvantages of the related art.

It is therefore a feature of an embodiment to provide an organic light-emitting display device with a structure capable of enhancing brightness by improving light coupling efficiency.

It is therefore another feature of an embodiment to provide a method of manufacturing an organic light-emitting display device with a structure capable of enhancing brightness by improving light coupling efficiency.

At least one of the above and other features and advantages may be realized by providing an organic light-emitting display device including a substrate, a first electrode on the substrate, the first electrode including a reflection film, a hole injection layer on the first electrode, a hole transport layer on the hole injection layer, an emission layer on the hole transport layer, an electron injection transport layer on the emission layer, a second electrode on the electron injection transport layer, the second electrode including a semi-transmissive reflective material, and a control layer positioned between an upper surface of the hole injection layer and a lower surface of the hole transport layer, the control layer including an organic material and having a refractive index lower than that of an adjacent layer.

The control layer may be within the hole injection layer. The hole injection layer may include a first hole injection layer and a second hole injection layer, and the control layer may be interposed between the first hole injection layer and the second hole injection layer.

The control layer may be interposed between the hole injection layer and the hole transport layer.

The control layer may be within the hole transport layer. The hole transport layer may include a first hole transport layer and a second hole transport layer, and the control layer may be interposed between the first hole transport layer and the second hole transport layer.

An image may be displayed from the emission layer toward the second electrode.

At least one of the above and other features and advantages may also be realized by providing a method of manufacturing an organic light-emitting display device, the method including forming a first electrode including a reflection film on a substrate, forming a hole injection layer on the first electrode, forming a hole transport layer on the hole injection layer, forming an emission layer on the hole transport layer, forming an electron injection transport layer on the emission layer, forming a second electrode formed of a semi-transmissive reflective material on the electron injection transport layer, and forming a control layer that has a refractive index lower than that of the adjacent layer and is formed of an organic material, during the formation of at least one from among the hole injection layer and the hole transport layer or after forming the hole injection layer.

The hole injection layer may include a first hole injection layer and a second hole injection layer, and the control layer may be formed between the forming of the first hole injection layer and the forming of the second hole injection layer.

The control layer may be formed between the forming of the hole injection layer and the forming of the hole transport layer.

The hole transport layer may include a first hole transport layer and a second hole transport layer, and the control layer may be formed between the forming of the first hole transport layer and the forming of the second hole transport layer.

The forming of the control layer may include depositing an organic material for forming the control layer on a substrate when the substrate is inclined at an acute angle with respect to a depositing direction.

BRIEF DESCRIPTION

The above and other features and advantages will become more apparent to those of ordinary skill in the art by describing in detail exemplary embodiments with reference to the attached drawings, in which.

DETAILED DESCRIPTION

Figure 1:
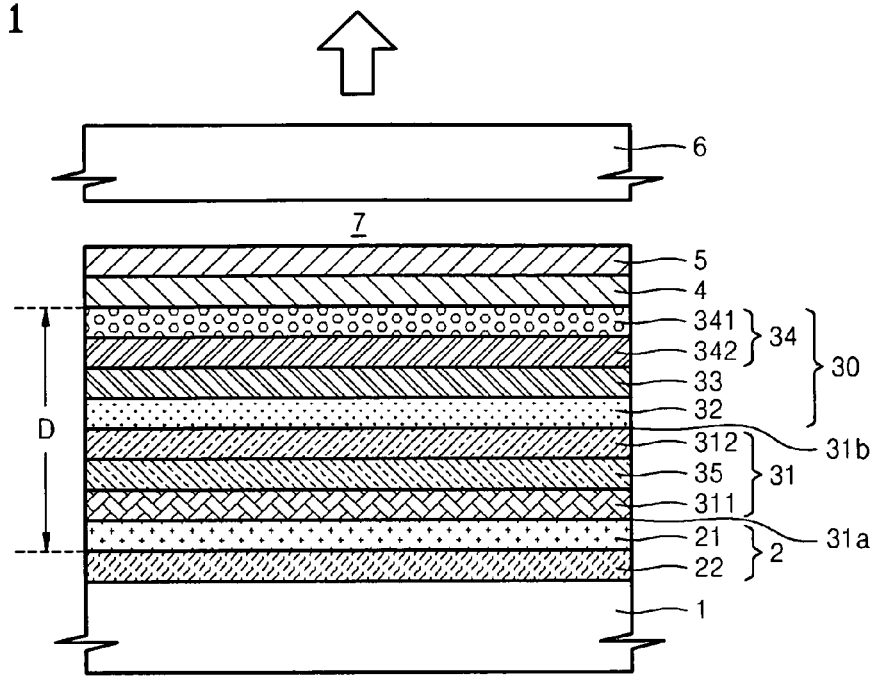
FIG. 1 illustrates a schematic cross-sectional view of a top emission type organic light-emitting display device according to an embodiment.

Korean Patent Application No. 10-2010-0016663, filed on Feb. 24, 2010, in the Korean Intellectual Property Office, and entitled: "Organic Light-Emitting Display Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic cross-sectional view of an organic light-emitting display device according to an embodiment. Referring to FIG. 1, the organic light-emitting display device may include a substrate 1 and a first electrode 2 formed on the substrate 1. The first electrode 2 may include a reflection film 22 and an anode 21.

The substrate 1 may be formed of, e.g., glass, plastic, or metal foil. When the substrate 1 is formed of metal foil, an insulating layer may be formed on the substrate 1 so as to insulate the first electrode 2 from the substrate 1. Further, a pixel circuit (not shown) including a thin film transistor (TFT) may be formed between the substrate 1 and the first electrode 2.

The reflection film 22 of the first electrode 2 may be formed of a metal having a high optical reflectivity, e.g., aluminum (Al), silver (Ag), magnesium (Mg), or the like. The anode 21 of the first electrode 2 may be formed of a material having a high (absolute value) work function, e.g., indium tin oxide (ITO), indium zinc oxide (IZO), $In_2O_3$, or the like. The reflection film 22 and anode 21 may be sequentially stacked on the substrate 1, but other configurations are within the inventive scope, e.g., an ohmic contact layer formed of the same material as an anode may be formed under the reflection film 22 to be electrically connected to the TFT in the pixel circuit.

As illustrated in FIG. 1, the organic light-emitting display device may further include a second electrode 4 facing the first electrode 2. The second electrode 4, e.g., a cathode, may be formed of a low work function (absolute value) metal alloy having high-conductivity, e.g., one or more of Ag, Mg, Al, platinum (Pt), palladium (Pd), gold (Au), nickel (Ni), neodymium (Nd), iridium (Ir), chromium (Cr), lithium (Li) or calcium (Ca), or may be formed in a stacked structure. The second electrode 4 may include a thin film formed of any one of the above metals, thus forming a semi-transmissive reflection film.

The organic light-emitting display device may include an organic layer 3 (FIG. 2) between the first electrode 2 and the second electrode 4. Referring to FIG. 1, the organic layer 3 may include an emission layer (EML) 33, and a hole injection layer (HIL) 31 and a hole transport layer (HTL) 32 that are formed between the emission layer 33 and the first electrode 2. Further, the organic layer 3 may include an electron injection transport layer 34 having an electron injection layer (EIL) 341 and an electron transport layer (ETL) 342 between the emission layer 33 and the second electrode 4.

According to the current embodiment, the HIL 31 may include a first HIL 311 and a second HIL 312, and may be formed on the first electrode 2. For example, the first HIL 311 may be formed between the first electrode 2 and the second HIL 312. In other words, a lower surface 31a of the HIL 31 may be a lower surface of the first HIL 311 and may be on, e.g., directly on, the anode 21, and an upper surface 31b of the HIL 31 may be an upper surface of the second HIL 312 and may, e.g., directly, contact the HTL 32.

The HTL 32 may be formed on the HIL 31, e.g., on the second HIL 312, and the EML 33 may be formed on the HTL 32. The ETL 342 may be formed on the EML 33, and the EIL 341 may be formed on the ETL 342. In other words, the HTL 32, EML 33, ETL 342, and EIL 341 may be formed sequentially on the second HIL 312.

The HIL 31 including the first HIL 311 and the second HIL 312 may be formed of a phthalocyanine compound, e.g., copper phthalocyanine (CuPc), or TCTA, m-MTDATA, or m-MTDAPB, which is a starburst amine-based material. The HTL 32 may be formed of, e.g., N,N'-bis(3-methylphenyl)-N,N'-diphenyl-[1,1-biphenyl]-4,4'-diamine (TPD), N,N'-di (naphthalene-1-yl)-N,N'-diphenyl benzidine(α-NPD), or the like. The EIL 341 may be formed of, e.g., LiF, NaCl, CsF, $Li_2O$, BaO, Liq, or the like. The ETL 342 may be formed of, e.g., Alq3.

A hole blocking layer (HBL) composed of a hole blocking material may be selectively formed between the EML 33 and the ETL 342. The hole blocking material is not particularly limited, but may have an electron-transport ability and an ionization potential higher than a light-emitting compound. For example, the hole blocking material may be Balq, BCP, TPBI or the like.

The EML 33 may include a host material and a dopant material. Examples of the host material may include tris 8-hydroxy-quinolinato)aluminum (Alq3, 9,10-di(naphth-2-yl)anthracene (AND), 3-tert-butyl-9,10-di(naphth-2-yl)anthracene (TBADN), 4,4'-bis 2,2-diphenyl-ethene-1-yl)-4,4'-dimethylphenyl (DPVBi), 4,4'-bis 2,2-diphenyl-ethene-1-yl)-4,4'-dimethylphenyl (p-DMDPVBi), tert 9,9-diarylfluorene)s (TDAF), 2-9,9'-spirobifluorene-2-yl)-9,9'-spirobifluorene (BSDF), 2,7-bis 9,9'-spirobifluorene-2-yl)-9, 9'-spirobifluorene (TSDF), bis 9,9-diarylfluorene)s (BDAF), 4,4'-bis 2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl) triphenylamine (TcTa), 4,4'-bis(carbazol-9-yl)biphenyl (CBP), 4,4'-bis 9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis 9-phenyl-9H-carbazol)fluorene (FL-4CBP), 4,4'-bis(carbazol-9-yl)-9,9-di-tolyl-fluorene (DPFL-CBP), 9,9-bis 9-phenyl-9H-carbazol)fluorene (FL-2CBP), etc. Examples of the dopant material may include DPAVBi 4,4'-bis[4-(di-p-tolylamino) styryl]biphenyl), ADN 9,10-di(naph-2-tyl)anthracene), TBADN 3-tert-butyl-9,10-di(naph-2-tyl)anthracene), etc.

As further illustrated in FIG. 1, a transparent passivation layer 5 formed of a transparent insulating material may be formed on the second electrode 4. A sealing substrate 6 may be spaced apart from the transparent passivation layer 5 with a predetermined gap 7 therebetween. The sealing substrate 6 may be formed of a glass or a plastic and bonded to the substrate 1 using a sealant (not shown). It is noted that the organic light-emitting display device according to example embodiments is a top emission type in which an image is displayed toward the sealing substrate 6 (in the direction of the arrow in FIG. 1).

Further, according to the current embodiment, the organic light-emitting display device may include a control layer 35 between the first HIL 311 and the second HIL 312. For example, the first HIL 311, the control layer 35, and the second HL 312 may be sequentially formed on the anode 21. In other words, the control layer 35 may be formed within the HIL 31, i.e., between the lower and upper surfaces 31a and 31b of the HIL 31. For example, the control layer 35 may be a continuous layer in direct contact with both the first and second HILs 311 and 312.

The control layer 35 may be formed of a material, e.g., organic material, having a refractive index lower than that of the first HIL 311 or the second HIL 312. For example, the control layer 35 may be formed of a material having a low refractive index, e.g., Alq3.

In another example, the control layer 35 may be formed by depositing a hole injection material through a method for decreasing a refractive index of the hole injection material. For example, the hole injection material may be deposited on the first hole injection layer 311 by inclining the substrate 1 at a predetermined acute angle with respect to a depositing direction. Then, even though the control layer 35 is formed of the same material as the adjacent first hole injection layer 311 and the second hole injection layer 312, the control layer 35 may have a refractive index lower than that of the first hole injection layer 311 or the second hole injection layer 312.

As such, the control layer 35 having a low refractive index may be formed between the first HIL 311 and the second HIL 312, so that an optical resonance effect between the first electrode 2 and the second electrode 4 may be maximized. Further, a distance D between the reflection film 22 and the second electrode 4 may be adjusted to satisfy a resonance condition.

To obtain the resonance condition, when a wave of light forms a node at surfaces of the reflection film 22 and the second electrode 4, a stationary wave can be generated. Accordingly, a condition for forming the node is obtained by Equation 1 below, where n denotes a refractive index of a film, d denotes a thickness of a film in which the node is formed, and m denotes a natural number.

$$\sum_{n}^{d} n \cdot d = \frac{\lambda}{2} \cdot m (m = 1, 2, 3 \ldots)$$ Equation 1

In general, the resonance condition may have some ranges in the above Equation 1 by an image dipole or other conditions. Accordingly, the thickness of the film satisfying the resonance condition, i.e., distance D between the reflection film 22 and the second electrode 4, may have a range as given by Equation 2 below, where m denotes a natural number and λ denotes a wavelength of light, $$\frac{\lambda}{2} \cdot m - \frac{\lambda}{10} \leq D \leq \frac{\lambda}{2} \cdot m + \frac{\lambda}{10}$$ Equation 2

The thickness of each layer of the organic layer 3 may be adjusted to meet the distance D. In particular, the control layer 35 may be formed so that efficiency of light moving from the EML 33 toward the reflection film 22 is increased, thereby maximizing the resonance effect of the entire organic light-emitting display device.

Figure 2:
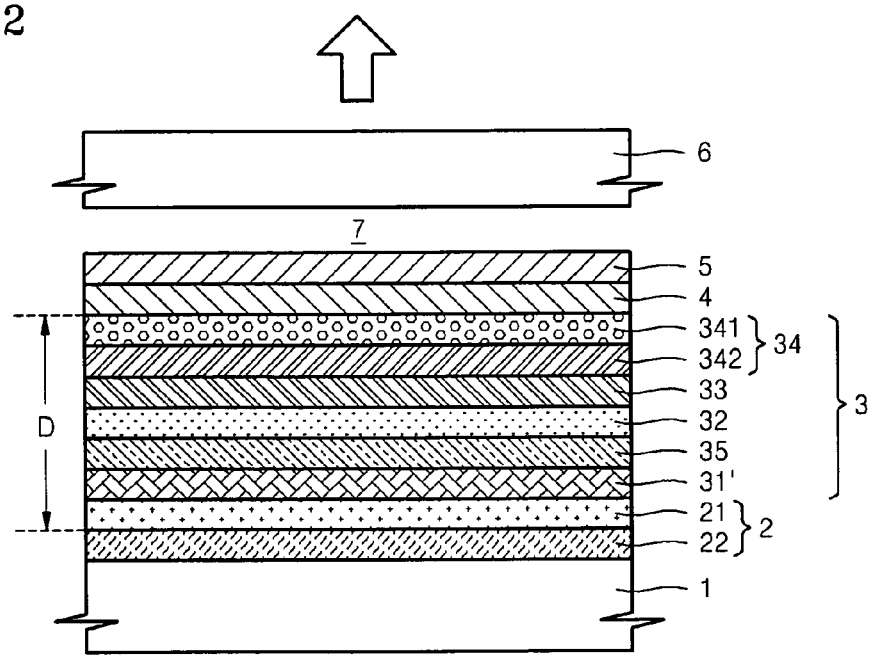
FIG. 2 illustrates a schematic cross-sectional view of a top emission type organic light-emitting display device according to another embodiment.

FIG. 2 illustrates an organic light-emitting display device according to another embodiment. The organic light-emitting display device in FIG. 2 is substantially the same as that in FIG. 1, with the exception of having a HIL 31' with a single-layered structure.

In particular, referring to FIG. 2, as both the HIL 31 and the HTL 32 are single layered, the control layer 35 may be formed between, e.g., directly between, the HIL 31' and the HTL 32. As described above, the control layer 35 may be formed of a material, having a refractive index lower than that of the HIL 31' or the HTL 32.

For example, the control layer 35 may be formed of Alq3. In another example, the control layer 35 may be formed of the same material as the HIL 31' or the HTL 32, and during deposition of the control layer 35, a depositing surface may be inclined with respect to a depositing direction to decrease the refractive index of the control layer 35.

Figure 3:
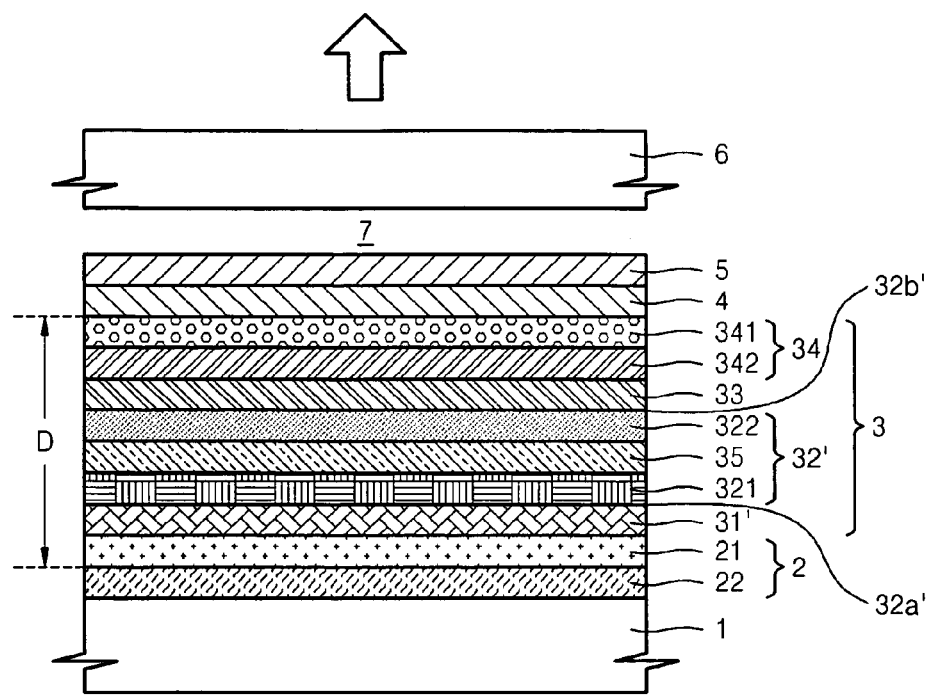
FIG. 3 illustrates a schematic cross-sectional view of a top emission type organic light-emitting display device according to another embodiment.

FIG. 3 illustrates an organic light-emitting display device according to another embodiment. The organic light-emitting display device in FIG. 3 is substantially the same as that in FIG. 2, with the exception of having a multi-layered HTL 32'.

In particular, referring to FIG. 3, the HIL 31' may have a single-layered structure, and the HTL 32' may include a first hole transport layer 321 and a second hole transport layer 322. The control layer 35 may be formed between the first HTL 321 and the second HTL 322. In other words, the HIL 31', the first HTL 321, the control layer 35, the second HTL 322, and the EML 33 may be formed sequentially on the anode 21. That is, the control layer 35 may be formed within the HTL 32', i.e., between lower and upper surfaces 32a' and 32b' of the HTL 32' that are facing respectively the first and second electrodes 2 and 4. As described above, the control layer 35 may be formed of a material having a refractive index lower than that of the HTL 321 or the second HTL 322.

For example, the control layer 35 may be formed of Alq3. In another example, the control layer 35 may be formed of the same material as the HTL 32', and during deposition of the control layer 35, a depositing surface may be inclined with respect to a depositing direction to decrease the refractive index of the control layer 35.

According to example embodiments, a control layer may be formed between a EML and a first electrode, e.g., between a lower surface of a HIL and an upper surface of a HTL, so that light coupling efficiency may be increased by maximizing the resonance effect of the entire organic light-emitting display device, thereby improving brightness of the organic light-emitting display device. Therefore, even if a transparent cathode exhibits low light transmission due to its low work function metal, light efficiency of the organic light-emitting display device may be improved.

In particular, as described previously, the control layer may have a single-layered structure positioned at one place, and an organic layer, i.e., a HTL and a HIL, may be formed between the EML and the first electrode. However, example embodiments are not limited thereto, and thus, the number of organic layers between the EML and the first electrode may be increased or decreased. In this case, the organic layers may form a multi-layered structure and may be positioned in any location of the organic layer. However, in this case, the layers need to have a refractive index lower than that of the organic layer contacting the control layer.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting display device, comprising:
   a substrate;

a first electrode on the substrate, the first electrode including a reflection film;
a hole injection layer on the first electrode;
a hole transport layer on the hole injection layer;
an emission layer on the hole transport layer;
an electron injection transport layer on the emission layer;
a second electrode on the electron injection transport layer, the second electrode including a semi-transmissive reflective material; and
a control layer positioned between an upper surface of the hole injection layer and a lower surface of the hole transport layer, the control layer including an organic material and having a refractive index lower than that of an adjacent layer.

2. The organic light-emitting display device as claimed in claim 1, wherein the control layer is within the hole injection layer.

3. The organic light-emitting display device as claimed in claim 2, wherein the hole injection layer includes a first hole injection layer and a second hole injection layer, the control layer being between the first and second hole injection layers and having a refractive index lower than that of the first and second hole injection layers.

4. The organic light-emitting display device as claimed in claim 1, wherein the control layer is directly between the hole injection layer and the hole transport layer.

5. The organic light-emitting display device as claimed in claim 1, wherein the control layer is within the hole transport layer.

6. The organic light-emitting display device as claimed in claim 5, wherein the hole transport layer includes a first hole transport layer and a second hole transport layer, the control layer being between the first and second hole transport layers and having a refractive index lower than that of the first and second hole transport layers.

7. The organic light-emitting display device as claimed in claim 1, wherein an image is displayed from the emission layer toward the second electrode.

8. A method of manufacturing an organic light-emitting display device, the method comprising:
forming a first electrode having a reflection film on a substrate;
forming a hole injection layer on the first electrode;
forming a hole transport layer on the hole injection layer;
forming an emission layer on the hole transport layer;
forming an electron injection transport layer on the emission layer;
forming a second electrode on the electron injection transport layer of a semi-transmissive reflective material; and
forming a control layer between an upper surface of the hole injection layer and a lower surface of the hole transport layer, the control layer including an organic material and having a refractive index lower than that of an adjacent layer.

9. The method as claimed in claim 8, wherein forming the hole injection layer includes forming a first hole injection layer and a second hole injection layer, the control layer being formed between the first and second hole injection layers and having a refractive index lower than that of the first and second hole injection layers.

10. The method as claimed in claim 8, wherein the control layer is formed directly between the hole injection layer and the hole transport layer.

11. The method as claimed in claim 8, wherein forming the hole transport layer includes forming a first hole transport layer and a second hole transport layer, the control layer being formed between the first and second hole transport layers and having a refractive index lower than that of the first and second hole transport layers.

12. The method as claimed in claim 8, wherein forming the control layer includes depositing an organic material for forming the control layer on a substrate, while the substrate is being inclined at an acute angle with respect to a depositing direction.

13. The method as claimed in claim 8, wherein the control layer is formed during formation of the hole injection layer or the hole transport layer.

* * * * *